United States Patent
Silberbauer et al.

(10) Patent No.: US 9,436,175 B2
(45) Date of Patent: Sep. 6, 2016

(54) METHOD FOR CONTROLLING THE MOVEMENT OF A COMPONENT OR MACHINE ELEMENT INHIBITED BY FRICTION

(75) Inventors: Martin Silberbauer, Vienna (AT); Gerald Zimmermann, Vienna (AT); Klaus Zimmermann, Bangalore (IN); Robert Neuburger, Vienna (AT)

(73) Assignee: ROBERT BOSCH GMBH, Stuttgart (DE)

( * ) Notice: Subject to any disclaimer, the term of this patent is extended or adjusted under 35 U.S.C. 154(b) by 1068 days.

(21) Appl. No.: 13/520,823

(22) PCT Filed: Dec. 20, 2010

(86) PCT No.: PCT/EP2010/070186
§ 371 (c)(1),
(2), (4) Date: Sep. 28, 2012

(87) PCT Pub. No.: WO2011/083034
PCT Pub. Date: Jul. 14, 2011

(65) Prior Publication Data
US 2013/0018502 A1 Jan. 17, 2013

(30) Foreign Application Priority Data
Jan. 8, 2010 (DE) .................. 10 2010 000 744

(51) Int. Cl.
*F02D 41/00* (2006.01)
*G05B 19/404* (2006.01)
*F02D 11/10* (2006.01)
*F02D 41/14* (2006.01)
*G01R 11/23* (2006.01)

(52) U.S. Cl.
CPC ......... *G05B 19/404* (2013.01); *F02D 41/0077* (2013.01); *F02D 41/1402* (2013.01); *F02D 2011/102* (2013.01); *F02D 2041/141* (2013.01); *G01R 11/23* (2013.01); *G05B 2219/41154* (2013.01); *G05B 2219/41161* (2013.01); *G05B 2219/45006* (2013.01); *G05B 2219/45018* (2013.01)

(58) Field of Classification Search
CPC .................. F02D 41/0077; F02D 2011/102; F02D 2011/104; F02D 2011/108
USPC ............... 701/108; 123/399, 568.21, 568.23, 123/568.24
See application file for complete search history.

(56) References Cited

U.S. PATENT DOCUMENTS 5,947,086 A * 9/1999 Hoshino ............... F02D 11/105
123/396
6,546,920 B1 * 4/2003 Kawamura ........ F02M 25/0756
123/568.23

(Continued)

FOREIGN PATENT DOCUMENTS

DE 37 31 983 4/1989
DE 196 47 219 5/1998

OTHER PUBLICATIONS

International Search Report, PCT International Application No. PCT/EP2010/070186, dated Feb. 18, 2011.

*Primary Examiner* — Erick Solis
(74) *Attorney, Agent, or Firm* — Norton Rose Fulbright US LLP

(57) ABSTRACT

A method for controlling the movement of a component or machine element inhibited by friction, an adaptive pilot control being carried out, in which a variable pilot control value is applied to the manipulated variable to compensate for a friction influence, the change of the pilot control value being determined as a function of an actual value.

12 Claims, 6 Drawing Sheets

(56) References Cited

U.S. PATENT DOCUMENTS

| | | | |
|---|---|---|---|
| 2002/0112709 A1* | 8/2002 | Itoi | F02D 41/0077 123/568.24 |
| 2004/0231641 A1 | 11/2004 | Wind | |
| 2008/0243357 A1* | 10/2008 | Asada | F02D 11/105 701/102 |
| 2012/0053812 A1* | 3/2012 | Bauerle | F02D 9/02 701/101 |

* cited by examiner

METHOD FOR CONTROLLING THE MOVEMENT OF A COMPONENT OR MACHINE ELEMENT INHIBITED BY FRICTION

FIELD OF THE INVENTION

The present invention relates to methods for controlling the movement of a component or machine element inhibited by friction.

BACKGROUND INFORMATION

Although reference is primarily made hereafter to exhaust gas recirculating valves in motor vehicles, the present invention is not restricted thereto, but rather is directed to all types of friction-inhibited movement controls. The movements of robot arms, valve flaps in general, motors in general (e.g., electric, hydraulic, pneumatic), etc., are mentioned here solely as examples.

Exhaust gas recirculation control decreases the NOx emissions in partial-load operation. A continuously-variable EGR valve is used and its opening position is controlled for this exhaust gas recirculation from the exhaust pipe to the intake manifold. An EGR valve is typically driven by a DC motor, which is continuously activated by a control unit (e.g., ECU or EDC) via a so-called H bridge. A position feedback unit on the EGR valve provides a position actual value to the control unit. A PID position controller is typically used.

However, a PID position controller may only overcome the friction (static friction and/or sliding friction) with the I (integral) component. The amplification of the I component must be kept small, however, to prevent oscillation of the control circuit at low frequencies. Therefore, it accordingly takes a long time until, e.g., the static friction is overcome. Slow, triangular pumping of the I component results, at an amplitude which corresponds to the static friction.

It is therefore desirable to provide an improved control for friction-inhibited movements.

SUMMARY

According to the present invention, an example method for controlling the movement of a component or machine element inhibited by friction is provided. Advantageous example embodiments are described below.

The present invention is based on the approach of compensating for the friction, in particular static friction, on the actuator in such a way that the controller sees a control loop without friction. As a result, the controller may be applied in particular using simple setting rules, e.g., according to the Ziegler-Nichols method, inter alia. For this purpose, an adaptive pilot controller is used, which learns the absolute value of the friction in each operating point during normal operation. A pilot control value is variably determined, which is to compensate for an instantaneously existing friction. The learning during normal operation is particularly advantageous, since the friction inhibiting the movement of the actuator may change continuously. For example, in an EGR valve, the friction is generally dependent on the sooting and the operating point. A rapid change of the friction is also possible if the soot covering on the actuator falls off suddenly. The friction may also change, for example, due to contamination, thickening or depletion of lubricants, etc., during movements in general, so that the present invention unfolds particular advantages here. The learning is advantageously performed based on an actual value, variables derived from an actual value, e.g., a control deviation, differentials, etc., also being included thereby. In contrast to typical pilot controllers, a variable pilot control value is used, the change of the pilot control value being determined as a function of the actual value.

Conventional EGR valves are often operated directly by a torque motor. A torque motor has a high torque, so that no gearing mechanism is required between the motor and the EGR valve. The service life of a gearing mechanism may be decreased by the friction compensation. Such an EGR valve operated without a gearing mechanism therefore appears to be particularly suitable for the application of the present invention.

In one example embodiment, the pilot control value is determined based on the observation of the time curve of a difference between a comparison signal and a preset value. The comparison signal may be obtained, e.g., as the difference between the actual value and a filtered actual value, for example, a PT1-filtered actual value, or may be defined by the control deviation. The preset value is advantageously zero, so that the time curve of the comparison signal may be considered alone.

In one preferred embodiment, the pilot control value is determined based on the observation of the time curve of the difference between the control deviation and the preset value. The time curve of the actual value may also be used alone instead of the control deviation.

The pilot control value is advantageously determined based on the observation of the time curve of the difference between the control deviation and the preset value with regard to a sign change. In other words, the adaptation may be considered based on the sign change behavior of the difference between the control deviation and the preset value. Sign changes are particularly simple to establish.

The adaptation may implemented in a preferred embodiment in such a way that in the event of a sign change, the pilot change value is decreased, and/or the pilot change value is increased if no sign change occurs within a pre-defined first period of time. The change of the pilot control value may take place step-by-step or continuously, in particular using an integrating element.

A sign change is advantageously only considered if the absolute value of the difference between the control deviation and the preset value after the sign change exceeds a predefinable band threshold value. In other words, sign changes within a predefined band around the preset value are not considered. Noise on the actual value would result, for example, in additional sign changes on the control deviation and therefore in an incorrect decrease of the pilot control value. A recognized sign change is therefore not considered if the absolute value of the difference between the control deviation and the preset value is less than the band threshold value.

It is advantageous to filter the setpoint value which is incorporated in the control deviation in order to decrease noise. Since, for example, the setpoint value of the EGR position controller is calculated from sensor signals, e.g., accelerator pedal position, speed, etc., the setpoint value signal may be subject to noise. Noise would result in additional sign changes on the control deviation and therefore in a pilot control value which is too low. For example, a PT1 filter may be used as the filter.

It is advantageous if the pilot control value is not changed if the component or machine element is located at a stop, since a stop would be recognized as friction, which would result in a distortion of the pilot control value.

In one example embodiment, the pilot control value is decreased when an oscillation of the movement is recognized. This is advantageous to reduce the tendency to oscillate.

The present invention is well suited for controlling the movement of a flap of an exhaust gas recirculating valve, the pilot control value additionally being able to be changed as a function of the actual position of the flap and an exhaust gas counter pressure.

It is advantageous, for example, using characteristic maps, to correct the learned friction by addition or multiplication as a function of the actual position and the exhaust gas counter pressure, to exclude apparent friction effects arising therefrom from the adaptation. For example, the force to be applied to adjust the EGR valve increases with the exhaust gas counter pressure. In addition, a dependency of the force on the actual position may exist.

It is advantageous to correct the pilot control value as a function of the speed of the movement of the component or machine element to separate static friction and sliding friction. When the actuator moves, it has overcome the static friction. The learned friction value may be corrected by multiplication using a characteristic curve, for example. At higher movement speeds, a value corresponding to the sliding friction is compensated for by factors less than 1.

The type of the determination of the pilot control value is advantageously changed as a function of the speed of the movement of the component or machine element. The learning of the friction may be slowed down or deactivated using a characteristic curve, for example, when the actuator is moving, because generally only the static friction is to be adapted. At higher movement speeds, the learning is slowed down by factors less than 1.

A computer unit according to the present invention, e.g., a control unit of a motor vehicle, is set up for the purpose, in particular by programming, of carrying out a method according to the present invention.

The implementation of the method in the form of software is also advantageous, since this entails particularly low costs, in particular if an executing control unit is still used for further tasks and is therefore present in any case. Suitable data carriers for providing the computer program are in particular diskettes, hard drives, flash memories, EEPROMs, CD-ROMs, DVDs, inter alia. A download of a program via computer networks (Internet, intranet, etc.) is also possible.

Further advantages and embodiments of the present invention result from the description and the figures.

It is understood that the above-mentioned features and the features to be explained hereafter are usable not only in the particular specified combination, but rather also in other combinations or alone, without departing from the scope of the present invention.

BRIEF DESCRIPTION OF THE DRAWINGS

The present invention is schematically shown in the figures on the basis of exemplary embodiments and is described in greater detail below with reference to the figures.

DETAILED DESCRIPTION OF EXAMPLE EMBODIMENTS

Figure 1:
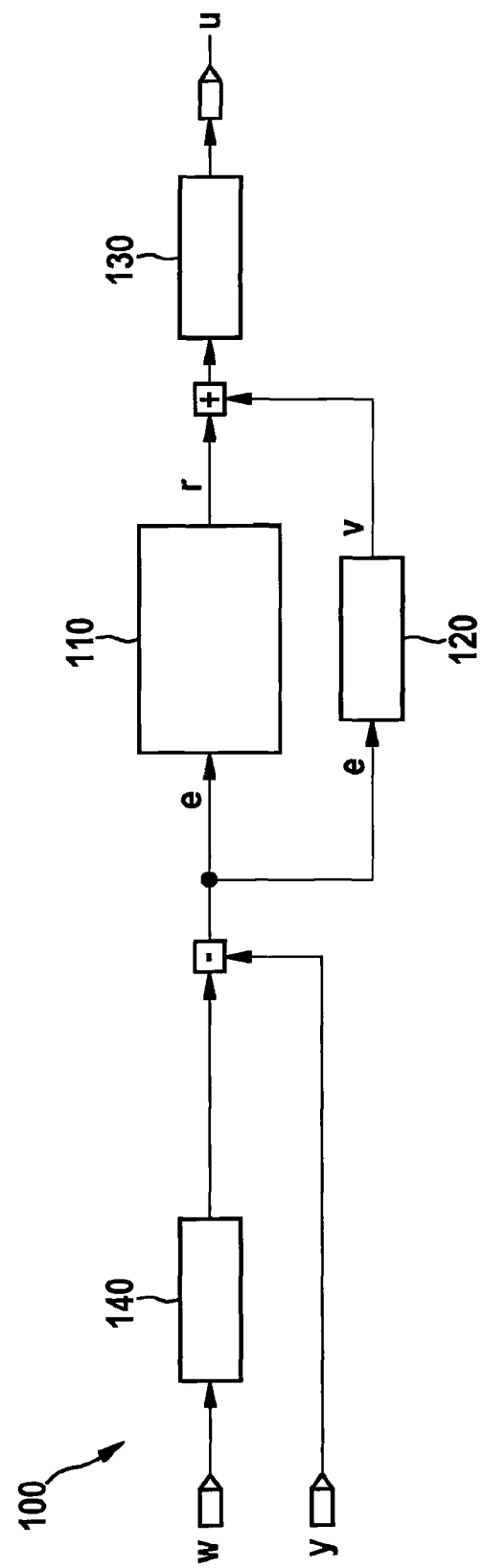
FIG. 1 shows a detail of a control circuit according to a preferred specific embodiment of the present invention.

FIG. 1 shows a detail 100 of a control circuit, which is used according to a particularly preferred specific embodiment of the present invention for movement control, for example, of a valve flap of an EGR valve. A control element 110, which is designed in the present case as a PID control element, is included in the control circuit. Control element 110 provides a controller output variable r in reaction to a control deviation e. The control deviation is determined as the difference between a reference variable (setpoint value) w and an actual value y. Reference variable w may be conducted via an optional slew rate element 140.

Control deviation e is also supplied to a pilot control element 120, which adaptively determines a pilot control value v, which is added to controller output variable r. The sum of controller output variable r and pilot control value v is supplied to an optional element 130 for manipulated variable restriction, which outputs a manipulated variable u.

Figure 2:
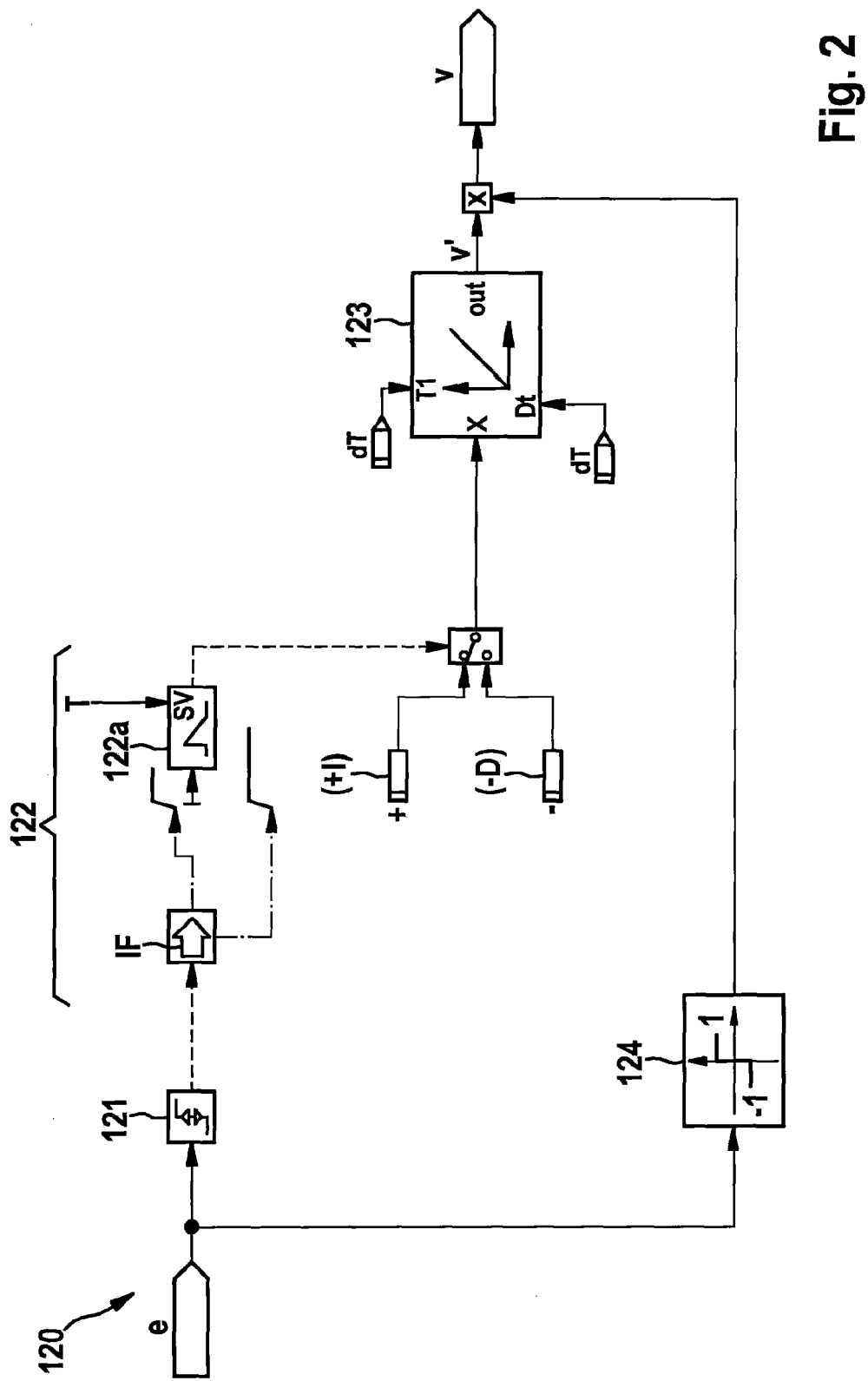
FIG. 2 shows a detail of the control circuit according to FIG. 1 in a more detailed illustration.

FIG. 2 shows a first preferred specific embodiment of pilot control element 120 in greater detail. As explained, control deviation e, from which pilot control value v is determined, is supplied to pilot control element 120.

Within pilot control element 120, control deviation e is supplied to an element 121 to determine a sign change. Element 121 is adjoined by an element 122, which presets an integration constant for predefining the integration speed and direction for an integrator 123. If a sign change is recognized, a negative integration constant −D is predefined for integrator 123. A time element 122a, which runs in a predefinable period of time T, is started simultaneously. If no further sign change occurs within period of time T, i.e., time element 122a is not restarted, it expires and switches a positive integration constant +I to integrator 123.

Integrator 123 determines a learned value v' as a function of the integration constant. Learned value v' is multiplied using the sign of control deviation e, which is determined via a sign element 124, to form pilot control value v.

Figure 3:
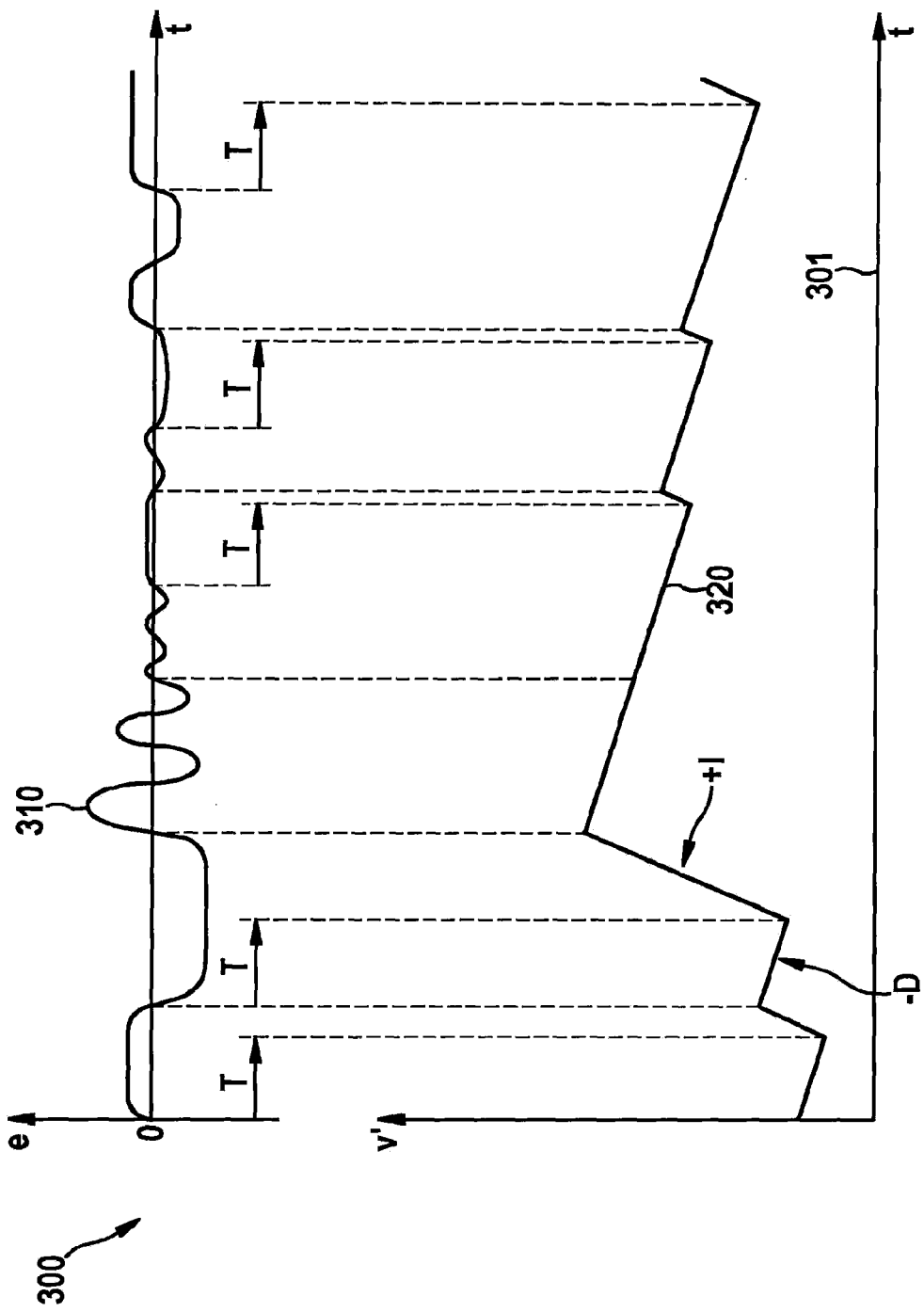
FIG. 3 shows a curve of a control deviation and the pilot control value resulting therefrom in a control circuit according to FIGS. 1 and 2.

In FIG. 3, in a graph 300, a curve 310 of a control deviation e and curve 320 resulting therefrom of learned value v' are each plotted against time t on an abscissa 301. It is apparent that learned value v' is decreased continuously after each sign change. The slope in these areas corresponds to negative integration constant −D. If no further sign change occurs within predefined period of time T after a sign change, learned value v' increases. The slope in these areas corresponds to positive integration constant +I.

Figure 4:
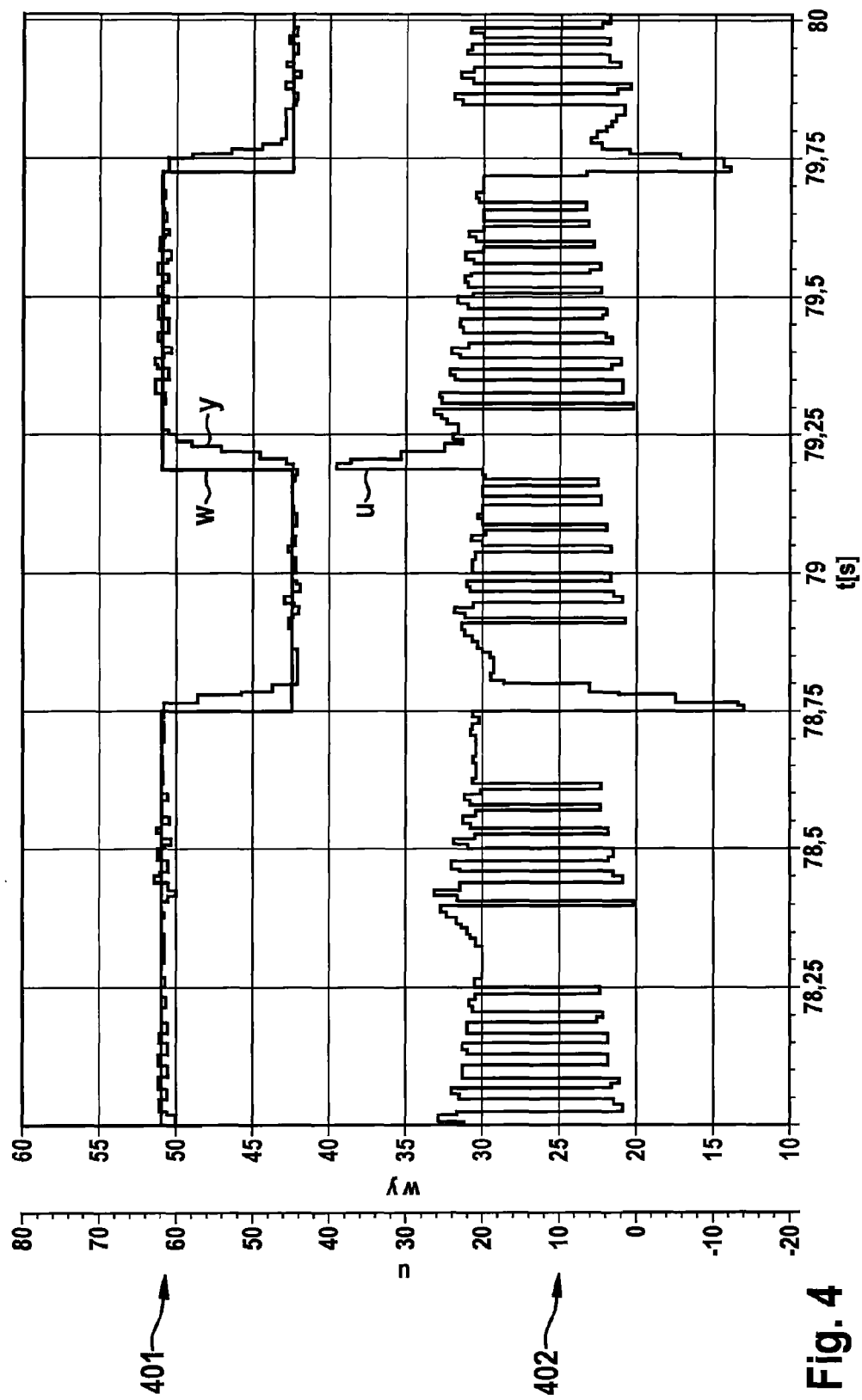
FIG. 4 shows a curve of the setpoint value and the actual value and the associated curve of the manipulated variable.

In FIG. 4, in a first graph 401, curves of setpoint value w and actual value y in percent are plotted against time t in seconds. It is apparent that because of the control according to the present invention, good conformance is achievable between the setpoint value and the actual value. In a graph 402, the associated curve of manipulated variable u in percent is also plotted against time t in seconds. Manipulated variable u is calculated, as explained, based on controller output variable r and pilot control value v.

Figure 5:
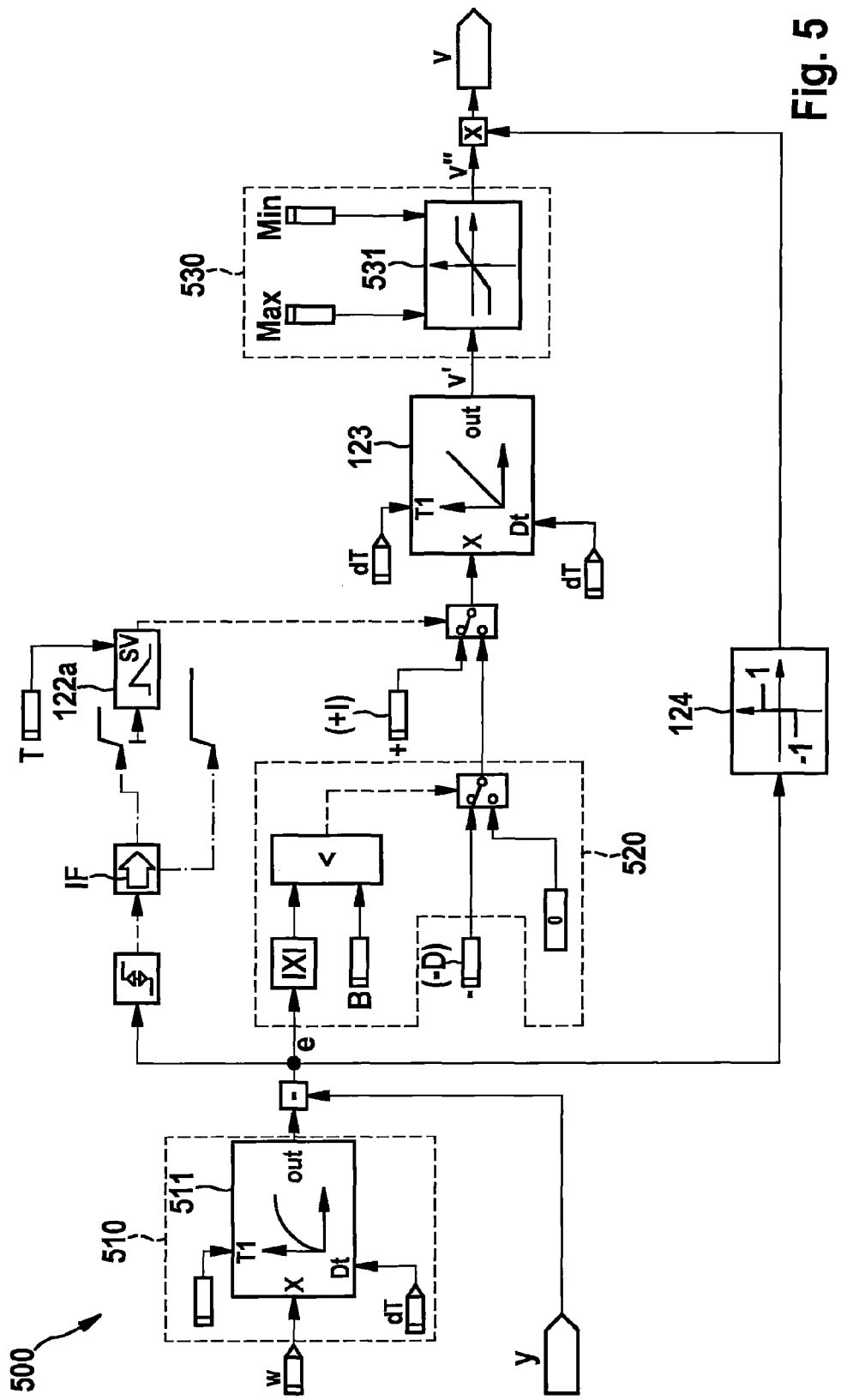
FIG. 5 shows a control circuit according to a further preferred specific embodiment of the present invention.

A further preferred specific embodiment of a control circuit 500 is shown in FIG. 5. Control circuit 500 is based on control circuit 100 according to FIG. 1, optional expansions being provided. Firstly, it is to be noted that the expansions are independent of one another and may therefore also be provided independently of one another in a control circuit. Identical elements in FIGS. 1, 2, and 5 are provided with identical reference numerals.

A first preferred expansion within control circuit 500 relates to the filtering of setpoint value w and is identified by reference numeral 510. The filtering is carried out in the present case by a PT1 element 511, to filter out noise of setpoint value w, which arises because setpoint value w is calculated based on measured values.

The second optional expansion is identified by reference numeral 520 and is used to reduce noise on the actual value. Noise on the actual value would result in additional sign changes of control deviation e, which would in turn result in a small learned value v'. To solve this problem, in the illustrated preferred specific embodiment, the absolute value of control deviation e is compared to a band threshold value B. If the absolute value of control deviation e is greater than band threshold value B, above-explained integration constant −D is applied. However, if control deviation e is less than band threshold value B, zero is applied.

A third optional expansion is identified by reference numeral 530 and relates to a restriction of learned value v'. For this purpose, learned value v' is fed to a limiting element 531, which keeps learned value v' between limits MIN and MAX and outputs a—possibly limited—learned value v". If learned value v' leaves one of the two limits, a so-called "anti-reset windup" acts, which prevents a wind-up of the integrator. If the MAX limit is exceeded, learned value v' is prevented from increasing further; in contrast, a decrease of learned value v' remains possible. If the value falls below the MIN limit, learned value v' is prevented from falling further; in contrast, an increase of learned value v' remains possible.

Figure 6:
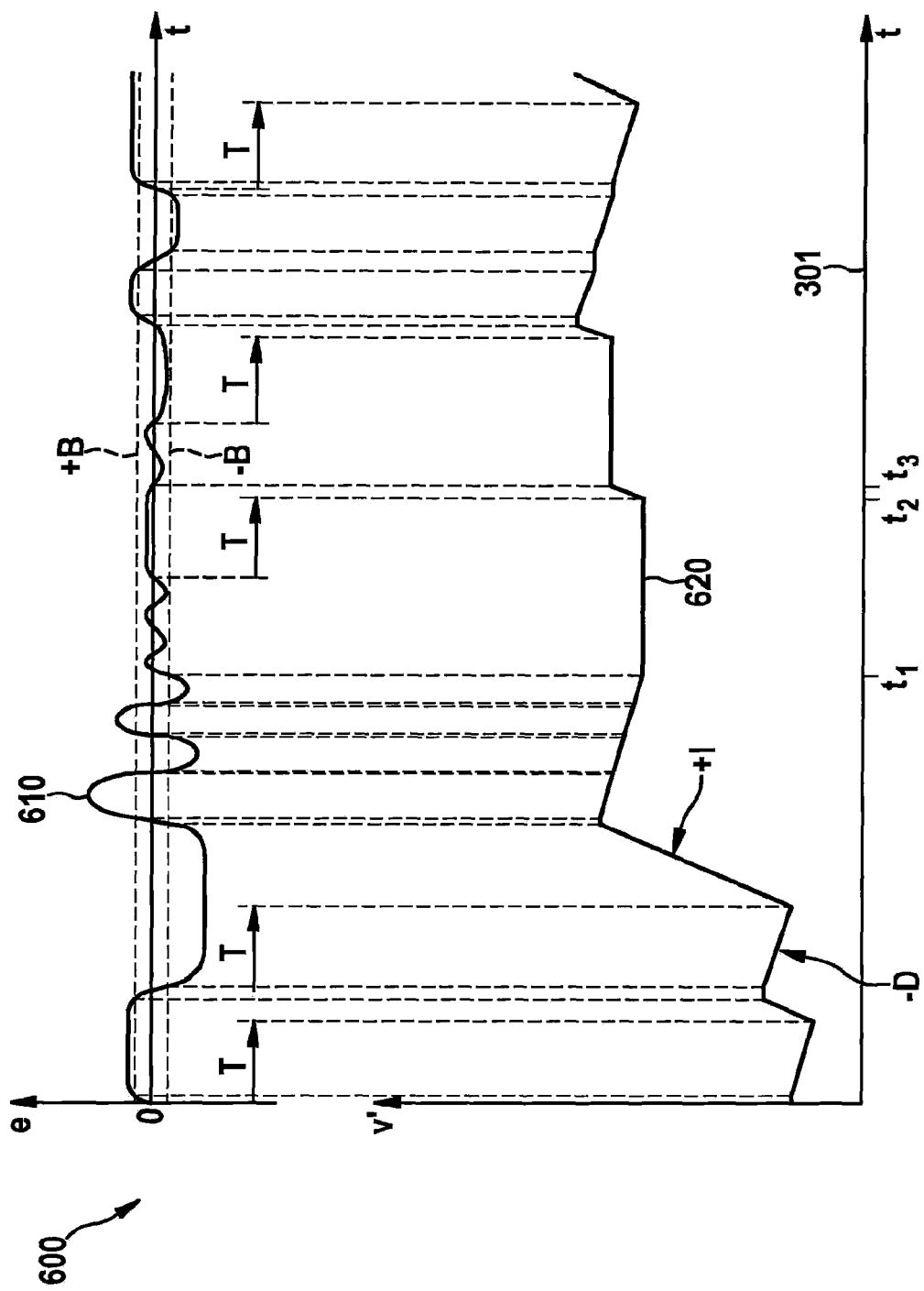
FIG. 6 shows a curve of a control deviation and the pilot control value resulting therefrom in a control circuit according to FIG. 5.

In FIG. 6, a graph 600 corresponding to graph 300 according to FIG. 3 is shown, which shows time curve 610 of a control deviation e and curve 620 resulting therefrom of learned value v' with application of a control circuit 500 according to FIG. 5. The elements in FIG. 6 which correspond to the elements in FIG. 3 are identified by the same reference numerals and are not described again at this point.

Through application of filtering 520, after each sign change of control deviation e, a horizontal curve of learned value v' initially occurs, until control deviation e leaves the range defined by band threshold value B. It is apparent that this does not occur for a long time after a point in time $t_1$, so that learned value v' initially no longer changes after point in time $t_1$. However, the passage of time interval T is still monitored during the entire time, so that at a point in time $t_2$, an increase of learned value v' is carried out. The increase is carried out until the next sign change at point in time $t_3$, a reduction of learned value v' not subsequently being carried out again, since the control deviation does not leave the range defined by band threshold value B around the preset value, zero here.

What is claimed is:

1. A method for controlling a movement of a component or machine element inhibited by friction, comprising:
    carrying out an adaptive pilot control in which a variable pilot control value is applied to a manipulated variable to compensate for a friction influence, a change of the pilot control value being determined as a function of a control deviation, an absolute value of the pilot control value being decreased in the event of a sign change of a difference between the control deviation and a preset value;
    wherein a movement of a flap of an exhaust gas recirculating valve is regulated, the pilot control value being changed as a function of an actual position of the flap and an exhaust gas counter pressure.

2. The method as recited in claim 1, wherein the absolute value of the pilot control value is increased if no sign change occurs within a predefined period of time.

3. The method as recited in claim 1, wherein the change of the pilot control value takes place one of step-by-step or continuously using an integrating element.

4. The method as recited in claim 1, wherein a sign change is taken into consideration only if the absolute value of the difference between the control deviation and the preset value after the sign change exceeds a predefined band threshold value.

5. The method as recited in claim 1, wherein the absolute value of the pilot control value is limited.

6. The method as recited in claim 1, wherein a setpoint value incorporated in the control deviation is noise-filtered.

7. The method as recited in claim 1, wherein the absolute value of the pilot control value is not changed if the component or the machine element is located at a stop.

8. The method as recited in claim 1, wherein the absolute value of the pilot control value is decreased when an oscillation of the movement of the component or machine element is recognized.

9. The method as recited in claim 8, wherein a type of determination of the pilot control value is changed as a function of a speed of the movement of the component or machine element.

10. The method as recited in claim 1, wherein the pilot control value is corrected as a function of a speed of the movement of the component or machine element.

11. The method as recited in claim 1, wherein the change of the pilot control value is determined as a function of the time derivative of the actual value.

12. A control unit, comprising:
    a control arrangement configured to control a movement of a component or machine element inhibited by friction by performing an adaptive pilot control in which a variable pilot control value is applied to a manipulated variable to compensate for a friction influence, a change of the pilot control value being determined as a function of a control deviation, an absolute value of the pilot control value being decreased in the event of a sign change of a difference between the control deviation and a preset value;
    wherein a movement of a flap of an exhaust gas recirculating valve is regulated, the pilot control value being changed as a function of an actual position of the flap and an exhaust gas counter pressure.

* * * * *